(12) United States Patent
Harayama et al.

(10) Patent No.: US 9,285,688 B2
(45) Date of Patent: Mar. 15, 2016

(54) EXPOSURE APPARATUS AND METHOD OF MANUFACTURING DEVICE

(71) Applicant: CANON KABUSHIKI KAISHA, Tokyo (JP)

(72) Inventors: Tomohiro Harayama, Utsunomiya (JP); Kouji Yoshida, Utsunomiya (JP); Mitsuo Hirata, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 297 days.

(21) Appl. No.: 14/045,943

(22) Filed: Oct. 4, 2013

(65) Prior Publication Data

US 2014/0104590 A1    Apr. 17, 2014

(30) Foreign Application Priority Data

Oct. 11, 2012   (JP) ................. 2012-226325

(51) Int. Cl.

| | |
|---|---|
| B64C 17/06 | (2006.01) |
| G03B 27/32 | (2006.01) |
| G03B 27/58 | (2006.01) |
| G03B 27/62 | (2006.01) |
| H02K 41/02 | (2006.01) |
| G03F 7/20 | (2006.01) |
| H01L 21/68 | (2006.01) |

(52) U.S. Cl.
CPC ........ *G03F 7/70725* (2013.01); *G03F 7/70775* (2013.01); *H01L 21/682* (2013.01)

(58) Field of Classification Search
CPC ............ G03F 7/70725; G03F 7/70775; H01L 21/682
USPC ......... 310/12.06, 12.29; 318/649; 355/72, 75, 355/77
See application file for complete search history.

(56) References Cited

FOREIGN PATENT DOCUMENTS

JP    2004-030553 A    1/2004

*Primary Examiner* — Colin Kreutzer
(74) *Attorney, Agent, or Firm* — Rossi, Kimms & McDowell LLP (57) ABSTRACT

The present invention provides an exposure apparatus including a stage control system configured to control a stage for holding a substrate in accordance with a command value, a specifying unit configured to specify an exposure start time at which exposure on the substrate starts upon detecting exposure light illuminated on the substrate, and a main control system configured to calculate positions of the stage at a plurality of times in an exposure period for the substrate based on position information of the stage at an exposure start time specified by the specifying unit, obtain an average position of the stage in at least a partial period in the exposure period from the calculated positions of the stage at the plurality of times, and give a command value for matching the average position of the stage with a target position to the stage control system.

7 Claims, 8 Drawing Sheets

SPRING MASS MODEL

DRIVER LAG    SPRING MASS MODEL

EXPOSURE APPARATUS AND METHOD OF MANUFACTURING DEVICE

BACKGROUND OF THE INVENTION

1. Field of the Invention

The present invention relates to an exposure apparatus and a method of manufacturing a device.

2. Description of the Related Art

To manufacture a semiconductor device, an exposure apparatus is used, which projects the pattern of a reticle (mask) onto a substrate by using a projection optical system and transfers the pattern. In the exposure apparatus, the substrate stage which holds a substrate can move along a plane perpendicular to the optical axis of the projection optical system to illuminate exposure light at a desired position on the substrate.

Figure 14:
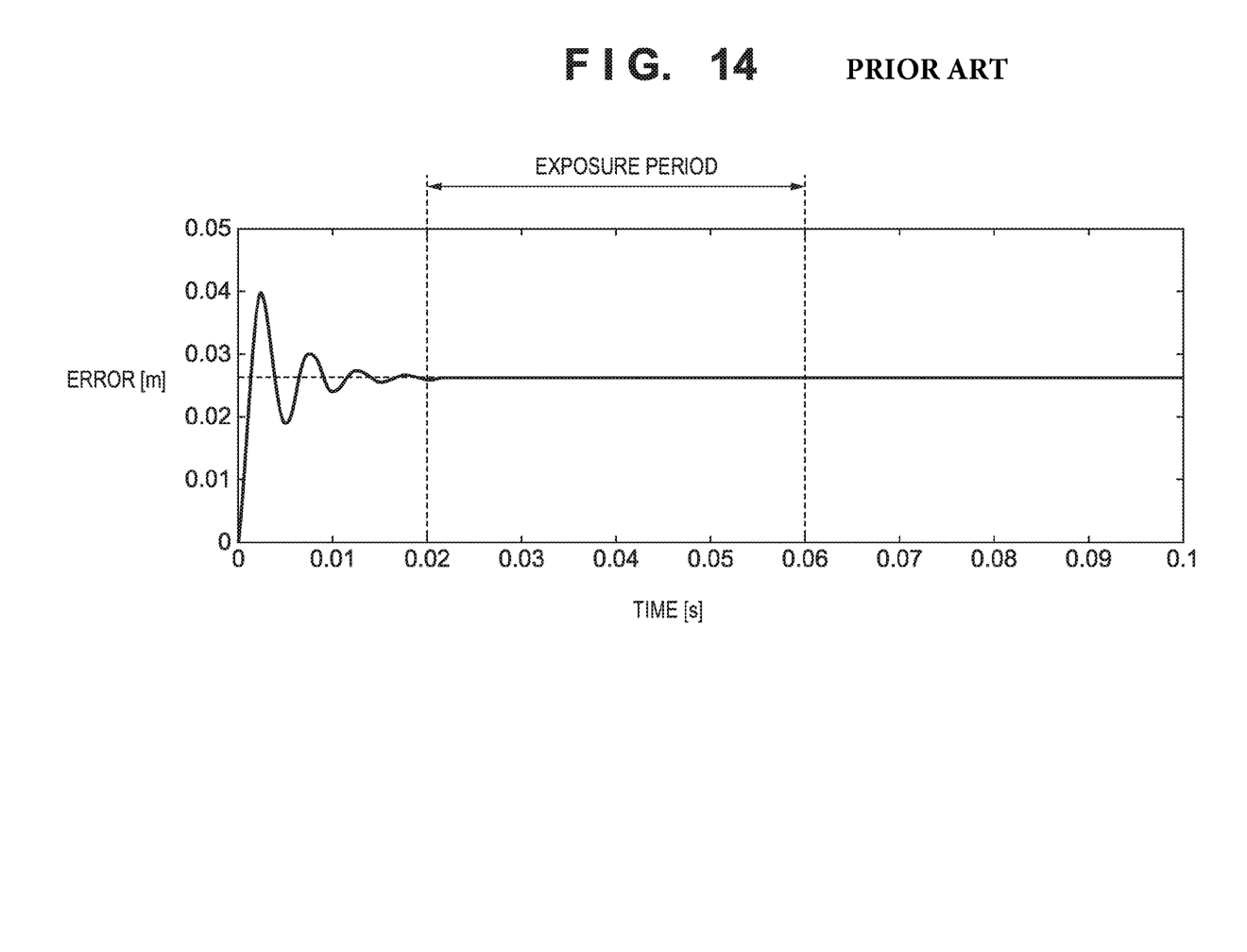
FIG. 14 is a graph showing temporal changes in the position of the substrate stage when the substrate stage moves given distances.

FIG. 14 is a graph showing temporal changes in the position of a substrate stage when the substrate stage is moved to a target position. Referring to FIG. 14, the abscissa takes the time [s] and the ordinate takes the error between the position of the substrate stage and a target position (to be referred to as a "stage error" hereinafter). The substrate stage generally converges to a target position while overshooting the target position. As shown in FIG. 14, the exposure apparatus performs exposure while the substrate stage converges to the target position to some extent. In an exposure period as well, however, since the vibration of the substrate stage due to the movement has not completely stopped, the substrate stage exists at a position deviated from the target position (that is, the position of the substrate stage does not completely match the target position).

A stage error in an exposure period is a factor that causes the positional shift of the pattern transferred to a substrate. More specifically, the average of stage errors in an exposure period appears as the positional shift of a pattern. It is therefore important to reduce stage errors in an exposure period. In addition, recently, in order to improve the productivity of an exposure apparatus, it is required to shorten settling time which means a period that the overshoot gradually settles down before exposure.

Under the circumstance, Japanese Patent Laid-Open No. 2004-030553 discloses a technique (model prediction control) which can predict a stage error by modeling input-output responses for a substrate stage (input: target position of a substrate stage, output: actual position of a substrate stage). If it is possible to predict a stage error, a target position may be given to the substrate stage so as to reduce the stage error.

It is, however, impossible to make a completely accurate model, and hence it is impossible to eliminate the stage error completely due to the modeling error. In an exposure apparatus, since the average of stage errors in an exposure period appears as the positional shift of a pattern, it is necessary to model the transfer characteristic of the substrate stage during the movement and the exposure. In other words, it is necessary to model a time schedule when the substrate stage starts to move and stop, and when the exposure starts and stops. But in reality, an actual exposure apparatus does not operate completely in accordance with the modeled time schedule. Thus the time lag causes a modeling error. Especially the exposure time lag deviates. Its modeling error cannot be neglected.

SUMMARY OF THE INVENTION

The present invention provides a technique advantageous in reducing the stage error.

According to one aspect of the present invention, there is provided an exposure apparatus which exposes a substrate, the apparatus including a stage configured to move upon holding the substrate, a stage control system configured to control the stage in accordance with a command value, a specifying unit configured to specify an exposure start time at which exposure on the substrate starts upon detecting exposure light illuminated on the substrate, and a main control system configured to calculate positions of the stage at a plurality of times in an exposure period for the substrate based on position information of the stage at an exposure start time specified by the specifying unit, obtain an average position of the stage in at least a partial period in the exposure period from the calculated positions of the stage at the plurality of times, and give a command value for matching the average position of the stage with a target position to the stage control system.

Further aspects of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1:
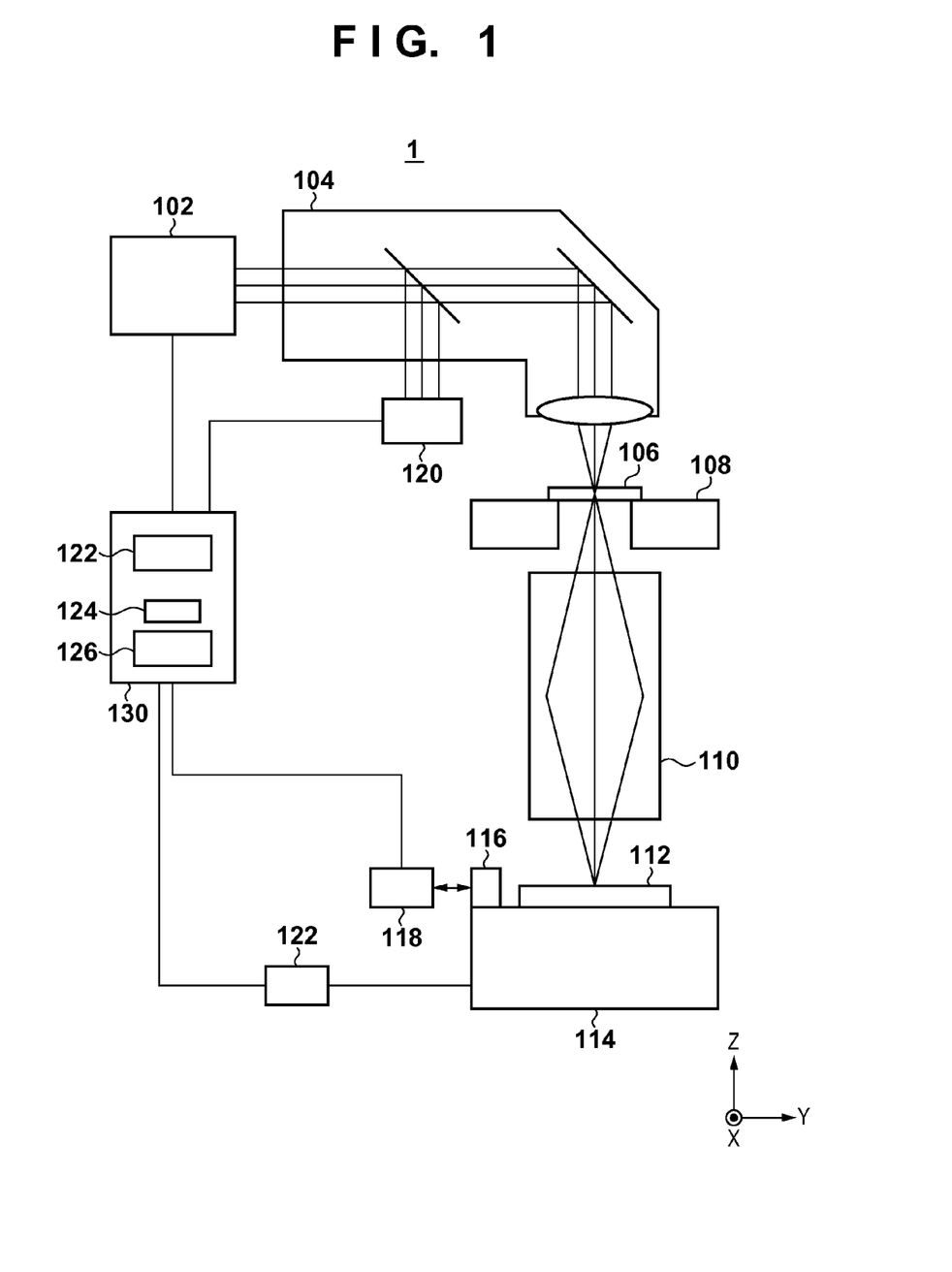
FIG. 1 is a schematic view showing the arrangement of an exposure apparatus according to an aspect of the present invention.

FIG. 1 is a schematic view showing the arrangement of an exposure apparatus 1 according to an aspect of the present invention. The exposure apparatus 1 is, for example, a lithography apparatus which transfers the pattern of a reticle (mask) onto a substrate (that is, exposes the substrate) by the step and repeat scheme.

The exposure apparatus 1 includes an illumination optical system 104 which illuminates a reticle 106 with light from a light source 102, a reticle stage 108 which holds and moves the reticle 106, and a projection optical system 110 which projects the pattern of the reticle 106 onto a substrate 112. The exposure apparatus 1 includes a substrate stage 114 which holds and moves the substrate 112, a reference mirror 116, a laser interferometer 118, a specifying unit 120, a stage control system 122, and a main control system 130.

The light source 102 uses, for example, an ultrahigh pressure mercury lamp (g-rays, h-rays, or i-rays). The types or number of light sources 102 to be used are not specifically limited. For example, it is possible to use excimer lasers such as a KrF excimer laser with a wavelength of about 248 nm and an ArF excimer laser with a wavelength of about 193 nm and an $F_2$ laser with a wavelength of about 157 nm.

The illumination optical system 104 is an optical system which illuminates the reticle 106 with light from the light source 102. The illumination optical system 104 includes a beam shaping optical system which shapes the shape of light from the light source 102 and an optical integrator which forms many secondary light sources to illuminate the reticle 106 with a uniform illuminant distribution.

The reticle 106 has a pattern to be transferred to the substrate 112. The reticle stage 108 holds and drives the reticle 106. The light diffracted by the reticle 106 (pattern) is projected on the substrate 112 through the projection optical system 110. The reticle 106 and the substrate 112 are arranged in an optically conjugate relationship. The exposure apparatus 1 is an exposure apparatus based on the step and repeat scheme, and hence exposes the substrate 112 while the reticle 106 and the substrate 112 remain at rest.

The reticle stage 108 includes a chuck for holding (suctioning) the reticle 106, and is configured to be movable in the X-axis direction, Y-axis direction, Z-axis direction, and rotational directions about the respective axes.

The projection optical system 110 is an optical system which projects the pattern of the reticle 106 onto the substrate 112. It is possible to use, as the projection optical system 110, a refractive system, catadioptric system, or reflective system.

The substrate 112 is a substrate onto which the pattern of the reticle 106 is projected (transferred). A resist (photoresist) is applied on the substrate 112. The substrate 112 includes a wafer, a glass plate, and other types of substrates.

The substrate stage 114 includes a chuck for holding (suctioning) the substrate 112, and is configured to be movable in the X-axis direction, Y-axis direction, Z-axis direction, and rotational directions about the respective axes. The reference mirror 116 used to measure the position of the substrate stage 114 is fixed to the substrate stage 114. The laser interferometer 118 measures the distance to the reference mirror 116 fixed to the substrate stage 114. The laser interferometer 118 functions as an acquisition unit which acquires information (position data) concerning the position of the substrate stage 114 in this embodiment. In this case, position data includes at least one of the position of the substrate stage 114 or the velocity of the substrate stage 114.

The specifying unit 120 specifies the exposure start time of starting exposure on the substrate 112 by detecting exposure light illuminated onto the substrate 112. The specifying unit 120 includes, for example, a half mirror which is disposed on the optical path of the illumination optical system 104 to reflect part of exposure light passing through the illumination optical system 104 and a sensor which detects the exposure light reflected by the half mirror, and specifies the time at which the sensor detects exposure light as an exposure start time.

The stage control system 122 controls the substrate stage 114 under the control of the main control system 130 (more specifically, in accordance with command values from the main control system 130).

The main control system 130 controls the operation (overall operation) of the exposure apparatus 1. For example, the main control system 130 acquires the position data of the substrate stage 114 at the exposure start time specified by the specifying unit 120 from the laser interferometer 118, and calculates the positions of the substrate stage 114 at a plurality of times in an exposure period for the substrate 112 based on the position data. The main control system 130 then obtains the average position of the substrate stage 114 in at least a partial period of the exposure period from the positions of the substrate stage 114 at the plurality of times in the exposure period, and gives a command value to the stage control system 122 to match the obtained position with a target position. In this case, the main control system 130 calculates (that is, performs model prediction computation) the positions of the substrate stage 114 at the plurality of times in the exposure period for the substrate 112 by using a model representing the position response of the substrate stage 114 which is the input-output characteristic of the stage control system 122. In this embodiment, the main control system 130 needs to complete such computation at high speed to start model prediction computation at the time at which the sensor of the specifying unit 120 has detected exposure light, that is, the exposure start time. For this purpose, the main control system 130 uses, as a model representing the position response of the substrate stage 114, a state space model which sequentially gives the positions of the substrate stage 114 at a plurality of times in an exposure period, with the position data of the substrate stage 114 at the exposure start time being the initial value.

Figure 2:
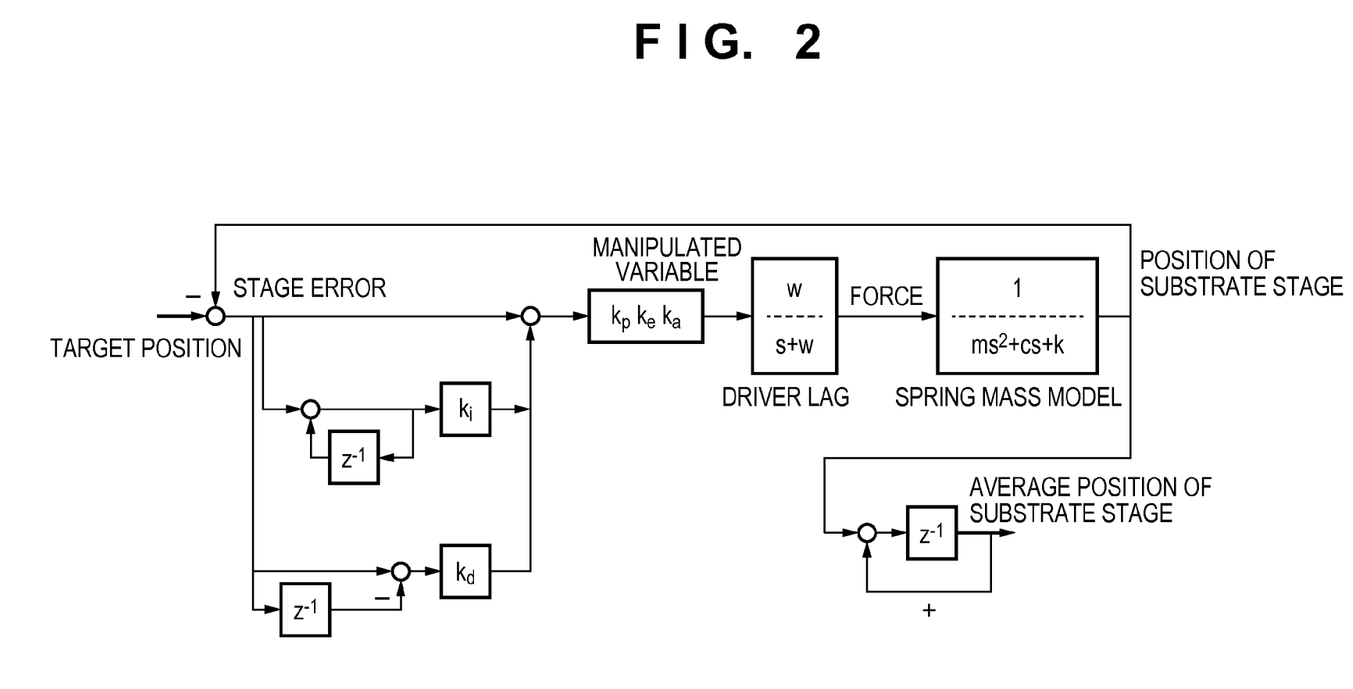
FIG. 2 is a block diagram showing how the input-output responses of the substrate stage of the exposure apparatus shown in FIG. 1 are modeled.

Modeling of the input-output responses of the substrate stage 114 in this embodiment will be described below. FIG. 2 is a block diagram showing how the input-output responses of the substrate stage 114 are modeled. When controlling the substrate stage 114, giving a target position to the substrate stage 114 will compute how much the current position of the substrate stage 114 deviates from the target position (the error (stage error) between the position of the substrate stage 114 and the target position). The value obtained by applying a PID gain to such an error is given as a manipulated variable to the driver of the substrate stage 114. The driver generates a force (motor force) for moving the substrate stage 114 in accordance with the given manipulated variable. Note however that since a slight lag occurs before the generation of the force, such a lag is modeled by using a first-order lag system.

This embodiment models the substrate stage 114 by using a spring mass. With a given force, the substrate stage 114 moves to a given position. The embodiment provides an integrator to obtain the average position of the substrate stage 114 in an exposure period (the entire duration of the exposure period).

The following is a procedure for sequentially constructing state space models in the respective blocks shown in FIG. 2 and finally constructing an extension system state space model which inputs a target position for the substrate stage 114 and outputs the average position of the substrate stage 114 in an exposure period.

Figure 3:
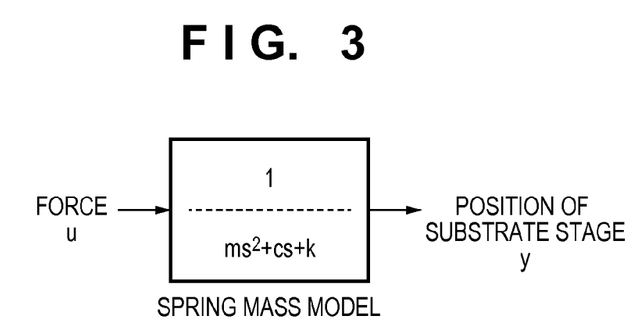
FIG. 3 is a view for explaining how the substrate stage of the exposure apparatus shown in FIG. 1 is modeled.

FIG. 3 is a view for explaining how the substrate stage 114 is modeled in this embodiment. As shown in FIG. 3, assume that the substrate stage 114 has a mass m, and a spring constant k and a viscosity coefficient c as a resisting force act on the substrate stage 114. Assume also that a force u is an input, and a position y of the substrate stage 114 is an output.

The model shown in FIG. 3 represents a one-input/one-output system in which when the force u is given to the substrate stage 114, the substrate stage 114 moves to the position y. Letting x be the position of the substrate stage 114, the balance between the force, spring force, viscous force, and inertial force given to the substrate stage 114 can be expressed by an equation (so-called motion equation) as follows:

$$m\ddot{x} + c\dot{x} + kx = u \tag{1}$$

Letting v be the velocity of the substrate stage 114, equation (2) given below can be obtained from equation (1):

$$m\dot{v} + cv + kx = u \tag{2}$$

In this case, transforming equation (2) into a determinant, with the position x and velocity v of the substrate stage 114 being state quantities, will obtain equations (3) given below:

$$m\dot{v} + cv + kx = u$$
$$\dot{v} = -\frac{k}{m}x - \frac{c}{m}v + \frac{1}{m}u$$
$$\begin{bmatrix}\dot{x}\\\dot{v}\end{bmatrix} = \begin{bmatrix}0 & 1\\-\frac{k}{m} & -\frac{c}{m}\end{bmatrix}\begin{bmatrix}x\\v\end{bmatrix} + \begin{bmatrix}0\\\frac{1}{m}\end{bmatrix}u \tag{3}$$

Expressing the relationship between state quantities and inputs in the form of a differential equation will be referred to as state space realization. In equations (3), the matrix associated with the state quantities is a matrix A, and the matrix associated with the input is a matrix B. The position y of the substrate stage 114, which is an output, is also a state quantity (x). This output is expressed by equation (4) given below:

$$y = \begin{bmatrix}1 & 0\end{bmatrix}\begin{bmatrix}x\\v\end{bmatrix} + [0]u \tag{4}$$

As indicated by equation (4), the output is also expressed by the linear sum of the state quantities and the input. In equation (4), the matrix associated with the state quantities is a matrix C, and the matrix associated with the input is a matrix D.

When, therefore, the substrate stage 114 is modeled with a spring mass, the input is the force u, the output is the position y of the substrate stage 114, and the state quantities are the position x and velocity v of the substrate stage 114. The matrices A, B, C, and D are expressed by equations (5) given below:

$$A = \begin{bmatrix}0 & 1\\-\frac{k}{m} & -\frac{c}{m}\end{bmatrix} \tag{5}$$

$$B = \begin{bmatrix}0\\\frac{1}{m}\end{bmatrix}$$

$$C = \begin{bmatrix}1 & 0\end{bmatrix}$$

$$D = \begin{bmatrix}0\\0\end{bmatrix}$$

Figure 4:
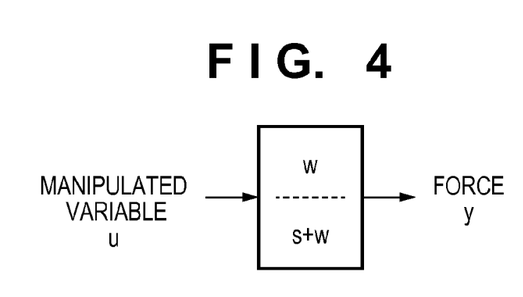
FIG. 4 is a view for explaining how the driver of the substrate stage of the exposure apparatus shown in FIG. 1 is modeled.

FIG. 4 is a view for explaining how the driver of the substrate stage 114 in this embodiment is modeled. As shown in FIG. 4, the driver of the substrate stage 114 is modeled by a first-order lag system. This is because when given a current for generating a force, the driver generates a force with a slight lag. The model shown in FIG. 4 represents one-input/one-output system which inputs a current command value (manipulated variable) u and outputs a force y generated in accordance with the current command value. If the state quantity x is a force, equation (6) given below is obtained:

$$x = \frac{\omega}{s + \omega}u \tag{6}$$

Since s represents a Laplace differential operator, equations (7) given below are obtained. In addition, the force y as an output is expressed by equation (8) given below:

$$x(s+\omega) = \omega u$$
$$sx = -\omega x + \omega u$$
$$\dot{x} = -\omega x + \omega u \tag{7}$$

$$y = [1]x + [0]u \tag{8}$$

When, therefore, the driver of the substrate stage 114 is modeled, the manipulated variable u, the force y, and the force x are respectively an input, an output, and a state quantity.

In addition, the matrices A, B, C, and D are expressed by equations (9) given below:

$$A = -\omega$$
$$B = \omega$$
$$C = 1$$
$$D = 0 \tag{9}$$

Figure 5:
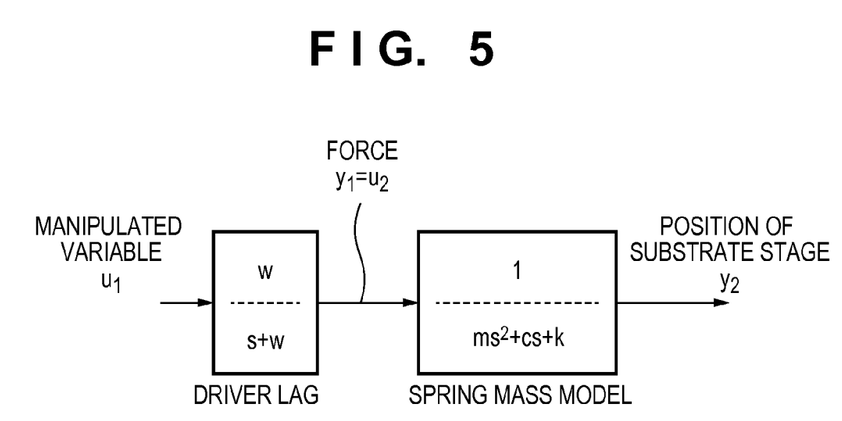
FIG. 5 is a view for explaining how the substrate stage of the exposure apparatus shown in FIG. 1 and the driver of the substrate stage are modeled.

In this case, the state space of the substrate stage 114 and the state space of the driver of the substrate stage 114 are coupled to realize an extension system state space. FIG. 5 is a view for explaining how the substrate stage 114 and the driver of the substrate stage 114 are modeled in this embodiment.

Referring to FIG. 5, when a manipulated variable u1 is given to the driver of the substrate stage 114, the driver generates a force $y_1$. The force $y_1$ corresponds to an input $u_2$ in the substrate stage 114, and hence $y_1 = u_2$. With the force $y_1$, the substrate stage 114 moves to a position $y_2$. The model shown in FIG. 5 represents a system which inputs the manipulated variable $u_1$ and outputs the position $y_2$ of the substrate stage 114. Therefore, the state space model of the driver of the substrate stage 114 is expressed by equations (10) given below, and the state space model of the substrate stage 114 is expressed by equations (11) given below:

$$A_{drv} = -\omega \qquad (10)$$
$$B_{drv} = \omega$$
$$C_{drv} = 1$$
$$D_{drv} = 0$$
$$\dot{X}_{drv} = A_{drv}X_{drv} + B_{drv}u_1$$
$$y_1 = C_{drv}X_{drv} + D_{drv}u_1$$

$$A_{stg} = \begin{bmatrix} 0 & 1 \\ -\dfrac{k}{m} & -\dfrac{c}{m} \end{bmatrix} \qquad (11)$$

$$B_{stg} = \begin{bmatrix} 0 \\ \dfrac{1}{m} \end{bmatrix}$$

$$C_{stg} = [1 \; 0]$$

$$D_{stg} = \begin{bmatrix} 0 \\ 0 \end{bmatrix}$$

$$\dot{X}_{stg} = A_{stg}X_{stg} + B_{stg}u_2$$
$$y_2 = C_{stg}X_{stg} + D_{stg}u_2$$

As described above, since $y_1 = u_2$, eliminating $u_2$ will obtain equation (12) given below from equations (10) and (11):

$$\dot{X}_{stg} = A_{xtg}X_{stg} + B_{stg}(C_{drv}X_{drv} + D_{drv}u_1) \qquad (12)$$

Therefore, the extension system obtained by coupling the state space of the substrate stage 114 and the state space of the driver of the substrate stage 114 is expressed by equations (13) given below, with $X_{plant}$ representing a state quantity, and the manipulated variable u and the position y of the substrate stage 114 being an input and an output, respectively:

$$X_{plant} = \begin{bmatrix} X_{stg} \\ X_{drv} \end{bmatrix} = \begin{bmatrix} x_{pos} \\ x_{val} \\ x_{force} \end{bmatrix} \qquad (13)$$

$$\begin{cases} \dot{X}_{plant} = A_{plant}X_{plant} + B_{plant}u \\ Y_{plant} = C_{plant}X_{plant} + D_{plant}u \end{cases}$$

$$\begin{cases} A_{plant} = \begin{bmatrix} A_{stg} & B_{stg}C_{drv} \\ 0 & A_{drv} \end{bmatrix} = \begin{bmatrix} 0 & 1 & 0 \\ -\dfrac{k}{m} & -\dfrac{c}{m} & \dfrac{1}{m} \\ 0 & 0 & -\omega \end{bmatrix} \\ B_{plant} = \begin{bmatrix} B_{stg}D_{drv} \\ B_{drv} \end{bmatrix} = \begin{bmatrix} 0 \\ 0 \\ \omega \end{bmatrix} \\ C_{plant} = [1 \; 0 \; 0] \\ D_{plant} = 0 \end{cases}$$

Figure 6:
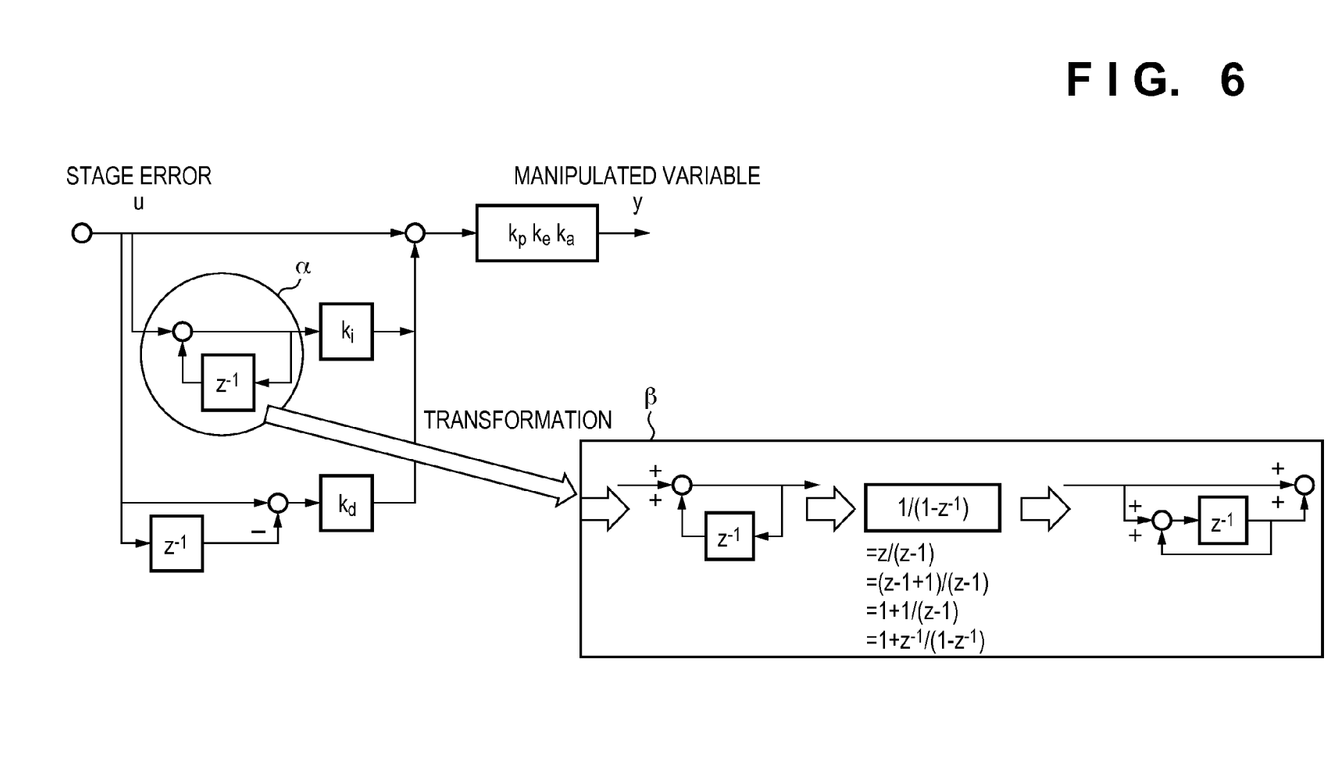
FIG. 6 is a block diagram of a PID controller included in the control system of the substrate stage of the exposure apparatus shown in FIG. 1.

FIG. 6 is a block diagram of a general PID controller included in a control system (the stage control system 122 and the main control system 130) which controls the substrate stage 114. As shown in FIG. 6, the PID controller inputs a stage error u and outputs a manipulated variable y to the driver of the substrate stage 114. Referring to FIG. 6, the input to the PID controller is branched into three terms: a proportional term P, an integral term I, and a differential term D in descending order. A proportional gain $k_p$ is applied to the total sum of the proportional term, integral term, and differential term. In addition, $k_e$ and $k_a$ are magnifications for transforming a computation result into a manipulated variable.

The integral term of the PID controller will be described with reference FIG. 6. In this case, $z^{-1}$ indicates that the process returns by one sample. Therefore, the integral term takes the sum of a stage error at a given time and a value passing through the corresponding route at a time preceding one sample, and applies a gain $K_i$ to the sum. As shown in FIG. 6, the integral term of the PID controller which is represented by α is transformed into the block diagram represented by β (that is, α is equivalent to β), and hence can be divided into a term proceeding without any change and a term which forwardly applies $z^{-1}$ and then feeds back.

Figure 7:
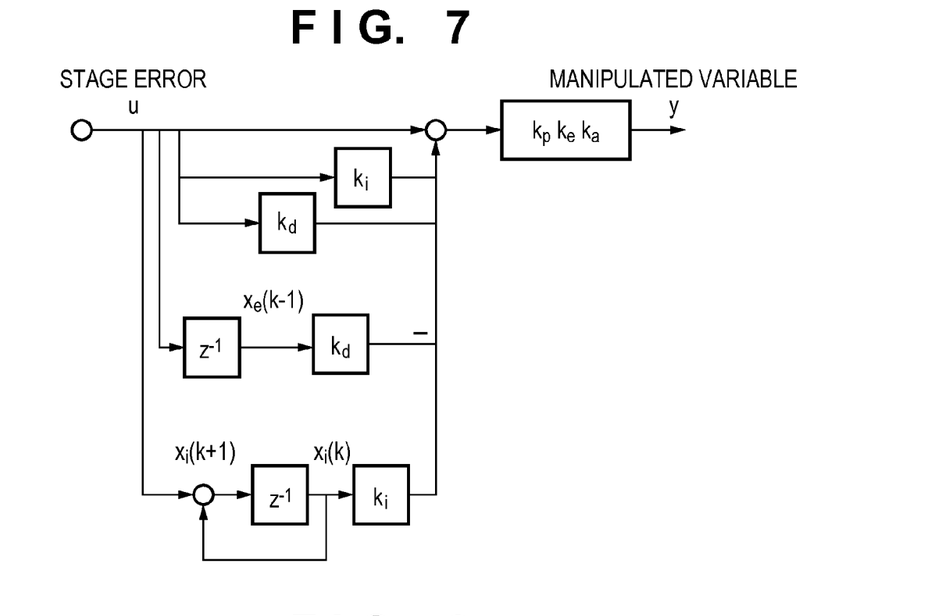
FIG. 7 is a view for explaining how the PID controller shown in FIG. 6 is modeled.

FIG. 7 is a view for explaining how the PID controller shown in FIG. 6 is modeled. Referring to FIG. 7, if a value $x_i(k)$ after passing through the $z^{-1}$ block located undermost at sampling time k and a value $x_e(k-1)$ after passing through the $z^{-1}$ block located in the middle at a time preceding one sample are state quantities, the relationship expressed by equation (14) given below:

$$\begin{cases} x_i(k+1) = x_i(k) + u(k) \\ x_e(k) = u(k) \end{cases} \qquad (14)$$

Expressing equation (14) in a matrix form will obtain equation (15) given below. In addition, a manipulated variable y as an output is expressed by equation (16) given below:

$$\begin{bmatrix} x_i(k+1) \\ x_e(k) \end{bmatrix} = \begin{bmatrix} 1 & 0 \\ 0 & 0 \end{bmatrix}\begin{bmatrix} x_i(k) \\ x_e(k-1) \end{bmatrix} + \begin{bmatrix} 1 \\ 1 \end{bmatrix}u(k) \qquad (15)$$

$$y(k) = \left\{[k_i \; -k_d]\begin{bmatrix} x_i(k) \\ x_e(k-1) \end{bmatrix} + [1+k_i+k_d]u(k)\right\}k_pk_ek_a \qquad (16)$$

The state space of the PID controller is realized, with a stage error u(k) at sampling time k being an input and a manipulated variable y(k) at sampling time k being an output. State quantities and matrices A, B, C, and D are expressed by equations (17) given below:

$$X_{ctrl}(k) = \begin{bmatrix} x_i(k) \\ x_e(k-1) \end{bmatrix} \qquad (17)$$

$$\begin{cases} X_{ctrl}(k+1) = A_{ctrl}X_{ctrl}(k) + B_{ctrl}u(k) \\ Y_{ctrl}(k) = C_{ctrl}X_{ctrl}(k) + D_{ctrl}u(k) \end{cases}$$

$$A_{ctrl} = \begin{bmatrix} 1 & 0 \\ 0 & 0 \end{bmatrix}$$

$$B_{ctrl} = \begin{bmatrix} 1 \\ 1 \end{bmatrix}$$

$$C_{ctrl} = k_pk_ek[k_i \; -k_d]$$

$$D_{ctrl} = k_pk_ek[1+k_i+k_d]$$

Figure 8:
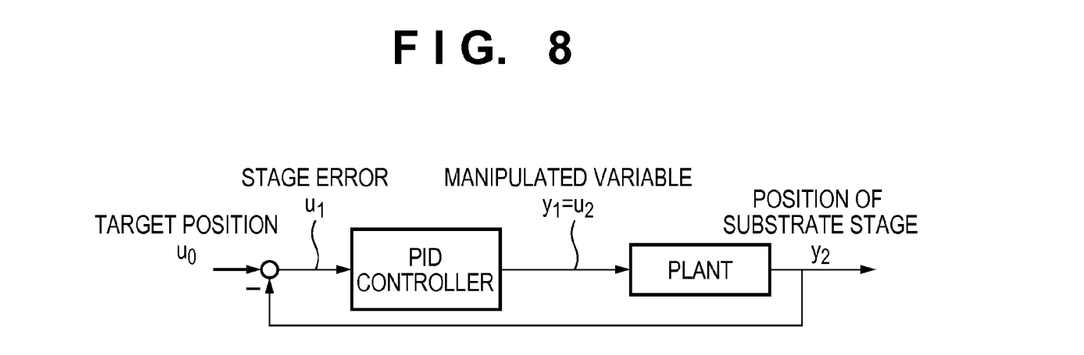
FIG. 8 is a view for explaining how the feedback loop system of the exposure apparatus shown in FIG. 1 is modeled.

Coupling the state space of the substrate stage 114 to the state space of the driver of the substrate stage 114 will obtain an extension system as a plant, thereby realizing the state space of the extension system of the feedback loop (closed loop) shown in FIG. 8. This extension system is a system which inputs a target position $u_0$ and outputs a position $y_2$ of the substrate stage 114. Referring to FIG. 8, the PID controller is expressed by equation (18) given below, and the plant is expressed by equation (19) given below:

$$X_{ctrl}(k) = \begin{bmatrix} x_i(k) \\ x_e(k-1) \end{bmatrix} \quad (18)$$

$$\begin{cases} X_{ctrl}(k+1) = A_{ctrl}X_{ctrl}(k) + B_{ctrl}u_1(k) \\ y_1(k) = C_{ctrl}X_{ctrl}(k) + D_{ctrl}u_1(k) \end{cases}$$

$$X_{plant}(k) = \begin{bmatrix} X_{stg}(k) \\ X_{drv}(k) \end{bmatrix} = \begin{bmatrix} x_{pos}(k) \\ x_{vel}(k) \\ x_{force}(k) \end{bmatrix} \quad (19)$$

$$\begin{cases} X_{plant}(k+1) = A_{plant}X_{plant}(k) + B_{plant}u_2(k) \\ y_2(k) = C_{plant}X_{plant}(k) \end{cases}$$

In this case, in order to unify formulae to be used into discrete type formulae, it is necessary to transform the formulae associated with the plant into discrete type formulae by bilinear transformation. Since the stage error $u_1$ is the difference between the target position $u_0$ and the position $y_2$ of the substrate stage 114, substitution of $u_1 = u_0 - y_2$ will yield equation (20) from equations (18) and (19).

$$\begin{cases} X_{ctrl}(k+1) = A_{ctrl}X_{ctrl}(k) + B_{ctrl}\{u_0(k) - C_{plant}X_{plant}(k)\} \\ \quad = -B_{ctrl}C_{plant}X_{plant}(k) + A_{ctrl}X_{ctrl}(k) + B_{ctrl}u_0(k) \\ y_1(k) = C_{ctrl}X_{ctrl}(k) + D_{ctrl}\{u_0(k) - C_{plant}X_{plant}(k)\} \end{cases} \quad (20)$$

The manipulated variable $y_1$ output from the PID controller corresponds to the input $u_2$ (that is, $y_1 = u_2$) in the plant, and hence substitution of $y_1$ into $u_2$ will obtain equation (21) given below:

$$X_{plant}(k+1) = A_{plant}X_{plant}(k) + B_{plant}[C_{ctrl}X_{ctrl}(k) + \quad (21)$$
$$D_{ctrl}\{u_0(k) - C_{plant}X_{plant}(k)\}]$$
$$= (A_{plant} - B_{plant}D_{ctrl}C_{plant})X_{plant}(k) +$$
$$B_{plant}C_{ctrl}X_{ctrl}(k) + B_{plant}D_{ctrl}u_0(k)$$

The state space of the feedback loop is realized with the target position u being an input and the position y of the substrate stage 114 being an output. State quantities and matrices A, B, C, and D are expressed by equations (22) given below. Note however that $A_{plant}$, $B_{plant}$, and $C_{plant}$ are the values discretized by bilinear transformation.

$$X_{cl}(k) = \begin{bmatrix} X_{plant}(k) \\ X_{ctrl}(k) \end{bmatrix} = \begin{bmatrix} x_{pos}(k) \\ x_{vel}(k) \\ x_{force}(k) \\ x_i(k) \\ x_e(k-1) \end{bmatrix} \quad (22)$$

$$\begin{cases} X_{cl}(k+1) = A_{cl}X_{cl}(k) + B_{cl}u(k) \\ Y_{cl}(k) = C_{cl}X_{cl}(k) + D_{cl}u(k) \end{cases}$$

$$\begin{cases} A_{cl} = \begin{bmatrix} A_{plant} - B_{plant}C_{plant}D_{ctrl} & B_{plant}C_{ctrl} \\ -B_{ctrl}C_{plant} & A_{ctrl} \end{bmatrix} = \begin{bmatrix} a_{11} & a_{12} & a_{13} & a_{14} & a_{15} \\ a_{21} & a_{22} & a_{23} & a_{24} & a_{25} \\ a_{31} & a_{32} & a_{33} & a_{34} & a_{35} \\ a_{41} & a_{42} & a_{43} & a_{44} & a_{45} \\ a_{51} & a_{52} & a_{53} & a_{54} & a_{55} \end{bmatrix} \\ B_{cl} = \begin{bmatrix} B_{plant}D_{ctrl} \\ B_{ctrl} \end{bmatrix} = \begin{bmatrix} b_1 \\ b_2 \\ b_3 \\ b_4 \\ b_5 \end{bmatrix} \\ C_{cl} = [C_{plant} \quad 0] = [1 \quad 0 \quad 0 \quad 0 \quad 0] \\ D_{cl} = 0 \end{cases}$$

Figure 9:
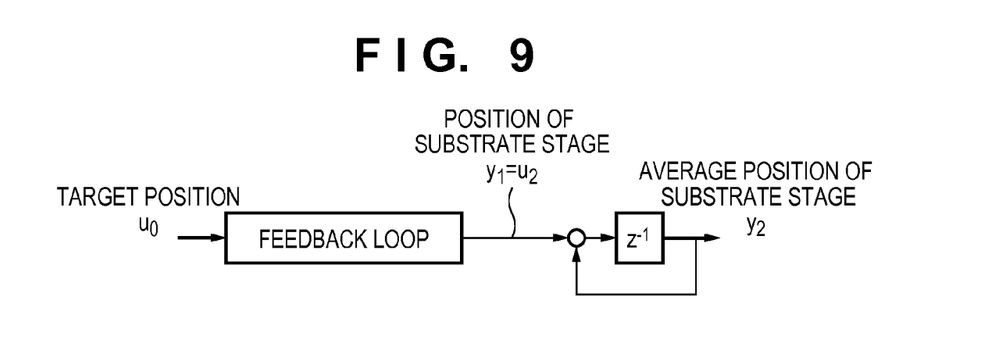
FIG. 9 is a view for explaining how the overall control system of the substrate stage of the exposure apparatus shown in FIG. 1 is modeled.

In this case, as shown in FIG. 9, the state space of an extension system is realized, which inputs a target position $u_0$ and outputs an average position $y_2$ of the substrate stage 114 in an exposure period. A feedback loop is represented by equation (23) given below:

$$\begin{cases} X_{cl}(k+1) = A_{cl}X_{cl}(k) + B_{cl}u_0(k) \\ y_1(k) = C_{cl}X_{cl}(k) + D_{cl}u_0(k) \end{cases} \quad (23)$$

A portion (an average computing unit) which computes the average position of the substrate stage 114 in an exposure period is expressed by equation (24) given below, assuming that a value $x_{avg}(k)$ after passing through the $z^{-1}$ block at sampling time k is a state quantity.

$$x_{avg}(k+1) = x_{avg}(k) + u_2(k) \quad (24)$$

The average position $y_2$ of the substrate stage 114 which is an output is expressed by equation (25) given below:

$$y_2(k) = x_{avg}(k) \quad (25)$$

In addition, equation (26) given below can be obtained from the relationship of y2=u2.

$$x_{avg}(k+) = x_{avg}(k) + \{_{cl}X_{cl}(k) + D_{cl}u_0(k)\} \quad (26)$$

The final state space is therefore realized, with the target position u of the substrate stage 114 being an input and the average position y of the substrate stage 114 in an exposure period being an output, and state quantities and matrices A, B, C, and D are expressed by equations (27):

$$X(k) = \begin{bmatrix} X_{cl}(k) \\ x_{avg}(k) \end{bmatrix} = \begin{bmatrix} X_{plant}(k) \\ X_{ctrl}(k) \\ x_{avg}(k) \end{bmatrix} = \begin{bmatrix} x_{pos}(k) \\ x_{vel}(k) \\ x_{force}(k) \\ x_i(k) \\ x_e(k-1) \\ x_{avg}(k) \end{bmatrix} \quad (27)$$

$$\begin{cases} X(k+1) = AX(k) + Bu(k) \\ Y(k) = CX(k) + Du(k) \end{cases}$$

$$A = \begin{bmatrix} A_{cl} & 0 \\ C_{cl} & 1 \end{bmatrix} = \begin{bmatrix} a_{11} & a_{12} & a_{13} & a_{14} & a_{15} & 0 \\ a_{21} & a_{22} & a_{23} & a_{24} & a_{25} & 0 \\ a_{31} & a_{32} & a_{33} & a_{34} & a_{35} & 0 \\ a_{41} & a_{42} & a_{43} & a_{44} & a_{45} & 0 \\ a_{51} & a_{52} & a_{53} & a_{54} & a_{55} & 0 \\ 1 & 0 & 0 & 0 & 0 & 1 \end{bmatrix}$$

$$B = \begin{bmatrix} B_{cl} \\ D_{cl} \end{bmatrix} = \begin{bmatrix} b_1 \\ b_2 \\ b_3 \\ b_4 \\ b_5 \\ 0 \end{bmatrix}$$

In this manner, it is possible to model a state space which inputs a target position for the substrate stage 114 and outputs the average position of the substrate stage 114 in an exposure period. It is therefore possible to calculate, at arbitrary time k, state quantities after time k if there are known state quantities (the position of the substrate stage, the velocity of the substrate stage, the force of the driver, the value of the integrator, a stage error at time k−1, and the value of the average computing unit at time k) and target positions after time k.

In the following operation, the above model is used to obtain the target position of the substrate stage 114 which zeros the average position of the substrate stage 114 (that is, zeros the stage error).

Let X(k) be a state quantity at given time k and u=[u1, u2 ... un] be the target position of the substrate stage 114 in the interval from time k to time k+n. In this case, equations (28) hold in the interval from time k+1 to time k+n.

$$X(k+1) = AX(k) + Bu(1) \quad (28)$$
$$X(k+2) = AX(k+1) + Bu(2)$$
$$\vdots$$
$$X(k+n) = AX(k+n-1) + Bu(n)$$

Sequentially multiplying the two sides of each equation (28) by $A^n, A^{n-1}, \ldots, A^{n-(n-1)}$ will obtain equations (29) given below:

$$A^n X(k+1) = A^n AX(k) + A^n Bu(1) \quad (29)$$
$$A^{n-1} X(k+2) = A^{n-1} AX(k+1) + A^{n-1} Bu(2)$$
$$\vdots$$
$$A^{n-(n-1)} X(k+n) = A^{n-(n-1)} AX(k+n-1) + A^{n-(n-1)} Bu(n)$$

Adding all equations (29) will obtain equations (30):

$$A^{n-(n-1)} X(k+n) = \quad (30)$$
$$A^n AX(k) + A^n Bu(1) + A^{n-1} Bu(2) + \ldots + A^{n-(n-1)} Bu(n)$$

$$X(k+n) = A^n X(k) + A^{n-1} Bu(1) + A^{n-2} Bu(2) + \ldots + A^{n-n} Bu(n)$$

$$= A^n X(k) + [A^{n-1}B \ A^{n-2}B \ \ldots \ A^{n-n}B] \begin{bmatrix} u(1) \\ u(2) \\ \vdots \\ u(n) \end{bmatrix}$$

If the average position of the substrate stage 114 at time k+n is represented by an output Y(k+n), equations (31) given below can be obtained:

$$Y(k+n) = CX(k+n) \quad (31)$$

$$= CA^n X(k) + C[A^{n-1}B \ A^{n-2}B \ \ldots \ A^{n-n}B] \begin{bmatrix} u(1) \\ u(2) \\ \vdots \\ u(n) \end{bmatrix}$$

The target position u for zeroing the average position of the substrate stage 114 at time k+n is represented by equation (32) given below:

$$0 = CA^n X(k) + C[A^{n-1}B \ A^{n-2}B \ \ldots \ A^{n-n}B] \begin{bmatrix} u(1) \\ u(2) \\ \vdots \\ u(n) \end{bmatrix} \quad (32)$$

Consider the matrices indicated by equation (32) in the following manner. The first term will be described first. A represents a matrix of 6 rows×6 columns, which remains 6 rows×6 columns regardless of the power to be multiplied. X(k) represents a state quantity at time k, and hence represents a matrix of 6 rows×1 column. Therefore, $A^n X(k)$ represents a matrix of 6 rows×1 column. Since C represents a matrix of 1 row×6 columns, $CA^n X(k)$ represents a scalar. The second term will be described next. As described above, A represents a matrix of 6 rows×6 columns, which remains 6 rows×6 columns regardless of the power to be multiplied. B represents a matrix of 6 rows×1 column, and hence AB represents a matrix of 6 rows×1 column. Therefore, the contents of the square brackets represent a matrix of 6 rows×n columns. In addition, C represents a matrix of 1 row×6 columns, and hence C×[ ] represents a matrix of 1 row×n columns. In consideration of them, the order of the matrices indicated by equation (32) is 0=scalar+[1×n]×[n×1].

In this case, decomposing target position u=[u1 u2 ... un] into target orbit r=[r1 r2 ... rn] and a gain g will obtain equations (33) given below:

$$0 = CA^n X(k) + C[A^{n-1}B \ A^{n-2}B \ \ldots \ A^{n-n}B] \begin{bmatrix} u(1) \\ u(2) \\ \vdots \\ u(n) \end{bmatrix} \quad (33)$$

$$= CA^n X(k) + [CA^{n-1}B \ CA^{n-2}B \ \ldots \ CA^{n-n}B]g \begin{bmatrix} r(1) \\ r(2) \\ \vdots \\ r(n) \end{bmatrix}$$

$$= CA^n X(k) + g(CA^{n-1}Br(1) + CA^{n-2}Br(2) + \ldots + CA^{n-1}Br(1))$$

-continued $$g = -\frac{CA''X(k)}{CA^{n-1}Br(1) + CA^{n-2}Br(2) + \ldots + CA^{n-1}Br(1)}$$

As described above, arbitrarily deciding the target orbit r will obtain the target position u which zeroes the average position of the substrate stage 114 according to u=gr. In this embodiment, although the target orbit r is a constant value, it is theoretically possible to take an arbitrary value.

Figure 10:
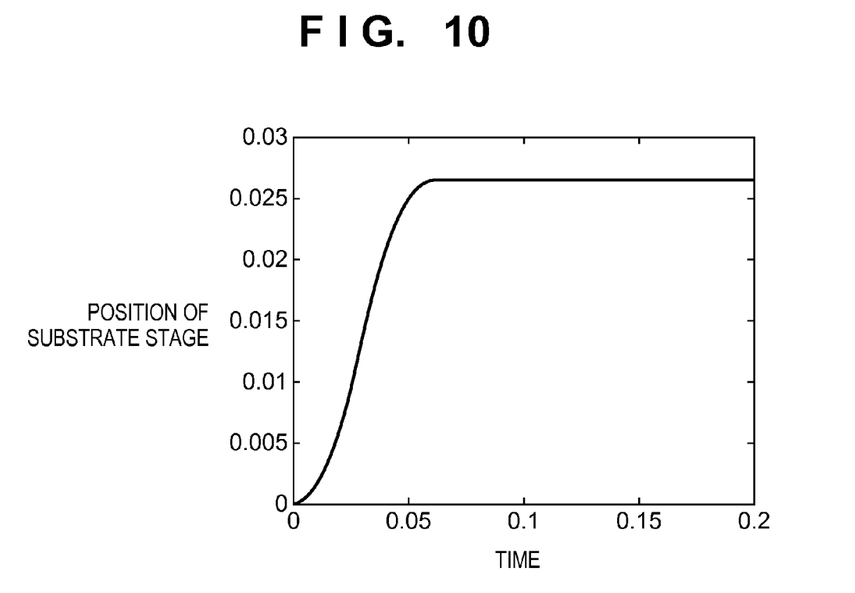
FIG. 10 is a graph showing time-series data representing the position of the substrate stage of the exposure apparatus shown in FIG. 1 when the substrate stage is moved to a target position.

In this case, features of the present invention will be described below by using time-series data representing the position of the substrate stage 114 when the substrate stage 114 is moved. FIG. 10 is a graph showing time-series data representing the position of the substrate stage 114 when the substrate stage 114 is moved to a target position. The time-series data shown in FIG. 10 is the data obtained by modeling the substrate stage 114, as described above. That is, the time-series data shown in FIG. 10 is the predictive values obtained from the model. Referring to FIG. 10, the abscissa takes the time [s] and the ordinate takes the position (distance) of the substrate stage.

As shown in FIG. 10, modeling the substrate stage 114 can calculate (predict) an output concerning a given target position (command value). Referring to FIG. 10, if the movement distance of the substrate stage 114 is about 26 mm, the substrate stage 114 has reached a target position near time 0.06 [s].

Figure 11:
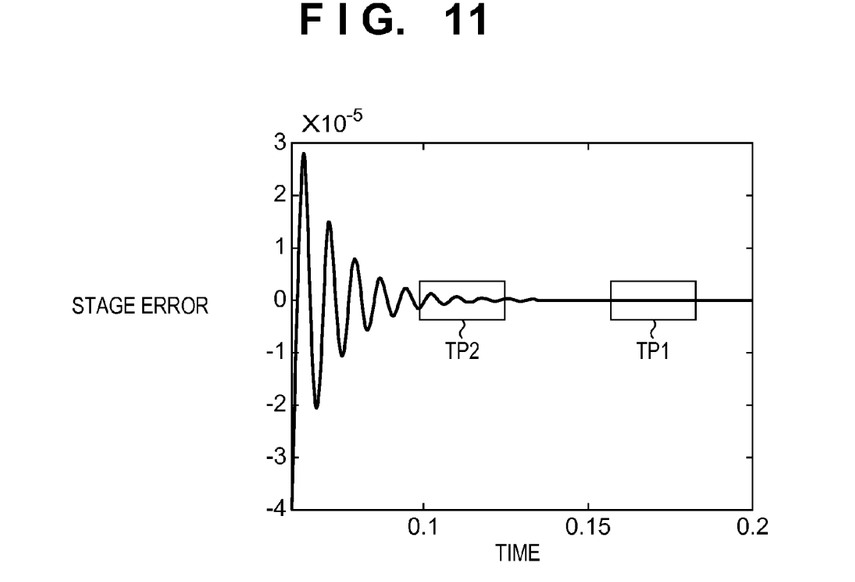
FIG. 11 is a graph showing stage errors at times from the time when the substrate stage of the exposure apparatus shown in FIG. 1 reaches a target position.

FIG. 11 is a graph showing stage errors at times after time 0.06 [s] at which the substrate stage 114 reaches a target position. FIG. 11 shows how the substrate stage 114 gradually converges to a target position (that is, stage errors converge to zero).

Reference symbol TP1 shown in FIG. 11 denotes an exposure period in a case in which the exposure apparatus is not required to achieve a high throughput and configured to perform exposure after the convergence of stage errors. In this case, since the average of stage errors in the exposure period TP1 is −0.39 nm, the stage errors are at a tolerable level. In contrast, as the exposure apparatus is required to achieve a high throughput, an exposure period TP2 shown in FIG. 11 is set (that is, the exposure start time is quickened). In this case, the average of stage errors in the exposure period TP2 is 464 nm and exceeds the tolerable level, thus leading to a serious problem.

Consider the influences of variations in exposure start time (that is, the time at which exposure light is illuminated onto a substrate). As described above, even if the average of stage errors in an exposure period is 464 nm, it is possible to cope with such a situation by predicting such an average and correcting a target position so as to eliminate the stage errors. In practice, however, since exposure start times vary, a model (conventional model) designed to keep an exposure start time constant is affected by variations in exposure start time, resulting in correction residual errors.

Figure 12:
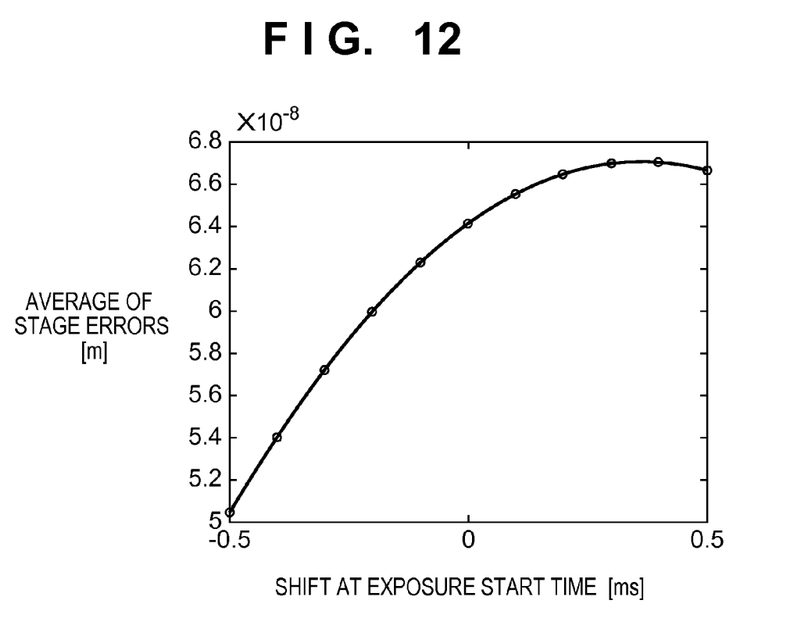
FIG. 12 is a graph showing the relationship between variations in exposure start time and the averages of stage errors.

FIG. 12 is a graph showing the relationship between variations in exposure start time and the averages of stage errors. Referring to FIG. 12, the abscissa takes exposure start time shifts [ms] from predetermined times, and the ordinate takes stage error averages [m]. FIG. 12 shows stage error averages when exposure start times from predetermined times vary in the interval between −0.5 ms and +0.5 ms. Referring to FIG. 12, the minimum stage error average is 504 nm, and the maximum stage error average is 671 nm. Recently, since an exposure apparatus has been required to achieve accuracy at the 10-nm level, such modeling errors of 100 nm or more raise a problem.

The exposure apparatus 1 of this embodiment specifies an actual exposure start time by using the specifying unit 120, and hence can reduce modeling errors due to the above variations in exposure start time.

Figure 13:
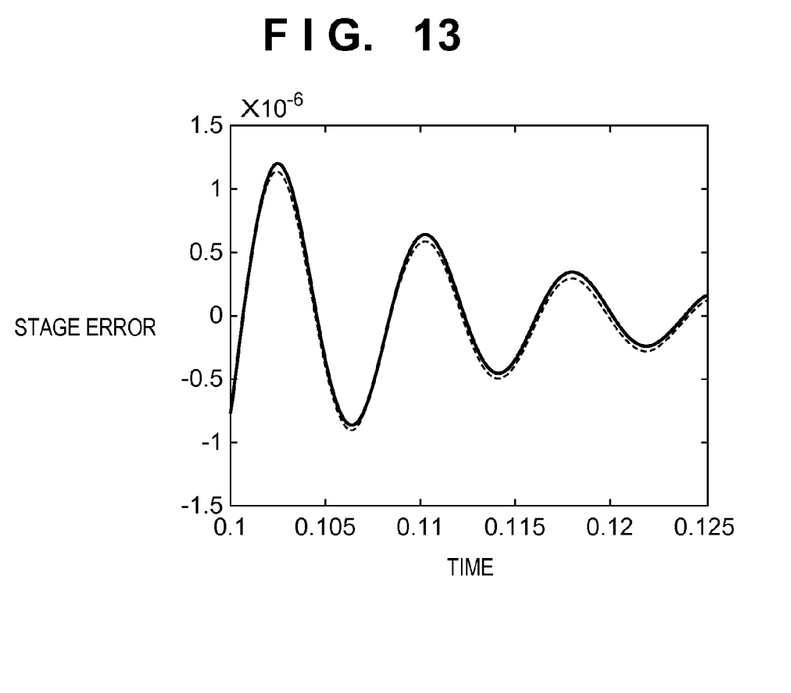
FIG. 13 is a graph showing time-series data representing stage errors in an exposure period.

FIG. 13 is a graph showing time-series data representing stage errors in an exposure period. Referring to FIG. 13, the abscissa takes the time [s] and the ordinate takes state errors. The solid line represents stage errors predicted from a conventional model. The average of stage errors in an exposure time is 464 nm. The dotted line represents stage errors (that is, stage errors in a case in which correction is performed to zero the average of stage errors) in this embodiment. Referring to FIG. 13, it is obvious that the dotted line is located slightly below the solid line. This is because, since the average of stage errors is 464 nm, which is a positive value, overall stage errors are corrected to shift to the negative side. According to this embodiment, since it is possible to specify an actual exposure start time, it is possible to greatly reduce modeling errors due to variations in exposure start time. More specifically, the embodiment can reduce the average of stage errors in an exposure period to 0.01 nm.

This embodiment can improve the accuracy of calculation (prediction) of the position of the substrate stage 114 by performing model prediction computation at an exposure start time. Model prediction computation is designed to use a state quantity at a given time to calculate a state quantity at the next time based on the model. That is, this computation is designed to calculate a predictive value at a given time from a state quantity at the immediately preceding time. Note that it is possible to calculate the position of the substrate stage 114 at an exposure start time at a time preceding the exposure start time. In this case, however, a state quantity at the exposure start time (the position or velocity of the substrate stage 114) is a value (predictive value) calculated from the model and differs from the actual value, and hence the accuracy of calculation of the position of the substrate stage 114 at a time after the exposure start time deteriorates.

This embodiment can perform model prediction computation by almost one matrix calculation because model prediction computation uses a state space model, and hence can implement ultrafast computation. In the embodiment, therefore, it is not necessary to perform model prediction computation in advance at a time preceding an actual exposure start time, and it is possible to perform model prediction computation at the exposure start time. This makes it possible to reduce modeling errors.

For example, the exposure apparatus controls the substrate stage at 0.25-ms intervals. Model prediction computation in this embodiment ends in several ns, although it depends on the performance of the computer. The position and velocity of the substrate stage are measured in advance by a laser interferometer and the like instead of being measured upon specifying an exposure start time. The measurement results are then stored in a memory or the like. Therefore, it takes 1 ns to acquire the position and velocity of the substrate stage upon specifying an exposure start time. As described above, since it takes several ns to terminate model prediction computation upon specifying an actual exposure start time, it is possible to satisfactorily cope with control on the substrate stage at 0.25-nm intervals.

In addition, the PID controller in this embodiment has a general arrangement as shown in FIG. 6. If, therefore, the substrate stage 114 smoothly (continuously) moves from a given position to another given position, no problem arises in conventional PID control.

This embodiment performs model prediction computation at an exposure start time and gives the command value obtained from the computation result to the PID controller. In this case, the proportional term computes a proportional magnification of a command value and the integral term computes an integral value of a command value without any problem. In contrast to this, the differential term produces a very large differential value because it is given a command value at an exposure start time instead of a command value at a time immediately before the exposure start time. Such a large command value may damage the device, and there is a possibility that the limitation of the performance of the device may lead failure to output the command value. For this reason, the apparatus may be configured to give no command value to the differential term of the PID controller, even though it gives command values to the proportional term and the integral term. In this case, however, it is necessary to change the state space model so as not to give any command value to the differential term of the PID controller.

In addition, this embodiment models the input-output responses of the substrate stage 114 and obtains a command value for matching its output (position) with a target position. In this case, conventional model prediction computation uses the receding horizon scheme of calculating a state quantity at a future time from a state quantity at a given time. Therefore, in the progress of time, a future period as an evaluation target progresses. In contrast to this, in the embodiment, the average of the positions of the substrate stage 114 in an exposure period (that is, in a specific period) serves as an evaluation target, and the period as the evaluation target does progress in the process of time.

The exposure apparatus 1 of this embodiment can reduce the error (stage error) between the position of the substrate stage 114 and a target position in an exposure period. The exposure apparatus 1 can therefore provide produces such as high-quality semiconductor devices, LCD elements, image sensing devices (CCDs and the like), thin-film magnetic heads, and the like. Such devices are manufactured through the step of exposing a substrate (wafer, glass plate, or the like) coated with a photoresist (photosensitizing agent) by using the exposure apparatus 1, the step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-226325 filed on Oct. 11, 2012, which is hereby incorporated by reference herein in its entirety.

What is claimed is:

1. An exposure apparatus which exposes a substrate, the apparatus comprising:
a stage configured to move upon holding the substrate;
a stage control system configured to control the stage in accordance with a command value;
a specifying unit configured to specify an exposure start time at which exposure on the substrate starts upon detecting exposure light illuminated on the substrate; and
a main control system configured to calculate positions of the stage at a plurality of times in an exposure period for the substrate based on position information of the stage at an exposure start time specified by the specifying unit, obtain an average position of the stage in at least a partial period in the exposure period from the calculated positions of the stage at the plurality of times, and give a command value for matching the average position of the stage with a target position to the stage control system.

2. The apparatus according to claim 1, wherein the main control system calculates positions of the stage at a plurality of times in an exposure period for the substrate by using a model representing a position response of the stage as an input-output characteristic of the stage control system.

3. The apparatus according to claim 2, wherein the model comprises a state space model which sequentially gives positions of the stage at a plurality of times in an exposure period for the substrate, with position data of the stage at the exposure start time being an initial value.

4. The apparatus according to claim 1, wherein position data of the stage includes at least one of a position of the stage at the exposure start time or a velocity of the stage at the exposure start time.

5. The apparatus according to claim 1, wherein the main control system gives the stage control system a command value for matching an average position of the stage in an entire period in the exposure period with a target position.

6. The apparatus according to claim 1, wherein the stage control system comprises a PID controller including a proportional term, an integral term, and a differential term, and the command value is not given to the differential term but is given to the proportional term and the integral term.

7. A device fabrication method comprising steps of:
exposing a substrate using an exposure apparatus; and
performing a development processing for the substrate exposed,
wherein the exposure apparatus includes:
a stage configured to move upon holding the substrate;
a stage control system configured to control the stage in accordance with a command value;
a specifying unit configured to specify an exposure start time at which exposure on the substrate starts upon detecting exposure light illuminated on the substrate; and
a main control system configured to calculate positions of the stage at a plurality of times in an exposure period for the substrate based on position information of the stage at an exposure start time specified by the specifying unit, obtain an average position of the stage in at least a partial period in the exposure period from the calculated positions of the stage at the plurality of times, and give a command value for matching the average position of the stage with a target position to the stage control system.

* * * * *